US010312901B2

(12) United States Patent
Xiao

(10) Patent No.: US 10,312,901 B2
(45) Date of Patent: Jun. 4, 2019

(54) TRAVELING-WAVE SWITCH WITH MULTIPLE SOURCE NODES

(71) Applicant: MACOM Technology Solutions Holdings, Inc., Lowell, MA (US)

(72) Inventor: Qun Xiao, Acton, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 15/785,724

(22) Filed: Oct. 17, 2017

(65) Prior Publication Data

US 2019/0115913 A1    Apr. 18, 2019

(51) Int. Cl.
*H03K 17/16* (2006.01)
*H01L 23/66* (2006.01)
*H01L 27/12* (2006.01)
*H04B 1/40* (2015.01)

(52) U.S. Cl.
CPC ............ *H03K 17/16* (2013.01); *H01L 23/66* (2013.01); *H01L 27/1203* (2013.01); *H01L 2223/6622* (2013.01); *H01L 2223/6627* (2013.01); *H01L 2223/6683* (2013.01); *H04B 1/40* (2013.01)

(58) Field of Classification Search
CPC ..... H03K 17/16; H01L 27/1203; H01L 23/66; H01L 2223/6683; H01L 2223/6627; H01L 2223/6622; H04B 1/40
See application file for complete search history.

(56) References Cited

U.S. PATENT DOCUMENTS

| 4,733,195 A | 3/1988 | Tserng et al. |
| 5,945,700 A | 8/1999 | Mizutani |
| 7,482,892 B2 * | 1/2009 | Tsai .................... H01P 1/15 333/103 |
| 7,532,087 B2 * | 5/2009 | Mizutani ............ H01P 1/15 333/104 |
| 2008/0099802 A1 | 5/2008 | Vice |
| 2014/0306270 A1 | 10/2014 | Kim et al. |
| 2015/0054594 A1 * | 2/2015 | Apriyana ............ H01P 1/15 333/103 |

OTHER PUBLICATIONS

Mizutani, Hiroshi, "DC-110-GHz MMIC Traveling-Wave Switch", IEEE Transactions on Microwave Theory and Techniques, vol. 48, No. 5, May 2000, pp. 840-845.
PCT Patent Application PCT/US2018/033075 filed on May 17, 2018, International Search Report and Written Opinion dated Jul. 31, 2018.

* cited by examiner

*Primary Examiner* — Jung Kim
(74) *Attorney, Agent, or Firm* — Thomas | Horstemeyer, LLP

(57) ABSTRACT

An apparatus includes a drain node, a plurality of source nodes and a gate node. The drain node may be configured to transfer a drain signal along a first axis from a first port to a second port. The source nodes may be (i) distributed along the first axis and (ii) configured to transfer a plurality of source signals along a second axis from the drain node to a ground node. The gate node may be (i) arranged in parallel to the drain node and (ii) configured to control the source signals in response to a gate voltage. The drain node, the source nodes and the gate node generally form a traveling-wave switch that blocks a slot mode current through the source nodes.

20 Claims, 10 Drawing Sheets

TRAVELING-WAVE SWITCH WITH MULTIPLE SOURCE NODES

FIELD OF THE INVENTION

The invention relates to solid-state switches generally and, more particularly, to a method and/or apparatus for implementing a traveling-wave switch with multiple source nodes.

BACKGROUND

Referring to FIG. 1, a diagram of a conventional traveling-wave switch 50 is shown. A gate voltage (i.e., Vg) is applied to a gate through a resistor Rg. When the gate voltage Vg is low, the switch 50 is considered closed. While closed, the switch 50 passes a current (i.e., $I_D$) through a drain between two ports. While the gate voltage Vg is high, the switch 50 is considered open. While open, the current $I_D$ is routed from the drain into a source as multiple currents (i.e., $I_{SA}$-$I_{SN}$). The currents $I_{SA}$-$I_{SN}$ induce a parasitic slot mode return current (i.e., $I_M$). The parasitic slot mode return current $I_M$ flows in an opposite direction of the current $I_D$. The parasitic slot mode return current $I_M$ degrades an insertion loss performance and an isolation performance of the switch 50.

It would be desirable to implement a traveling-wave switch with multiple source nodes.

SUMMARY

The invention concerns an apparatus including a drain node, a plurality of source nodes and a gate node. The drain node may be configured to transfer a drain signal along a first axis from a first port to a second port. The source nodes may be (i) distributed along the first axis and (ii) configured to transfer a plurality of source signals along a second axis from the drain node to a ground node. The gate node may be (i) arranged in parallel to the drain node and (ii) configured to control the source signals in response to a gate voltage. The drain node, the source nodes and the gate node generally form a traveling-wave switch that blocks a slot mode current through the source nodes.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a traveling-wave switch with multiple source nodes that may (i) reduce a slot mode current compared with common switches, (ii) operate with high-frequency signals, (iii) have an improved insertion loss performance compared with common switches, (iv) have an improved isolation performance compared with common switches and/or (vi) be implemented as one or more integrated circuits.

Embodiments of the invention generally provide new layouts (or designs) for traveling-wave switch transistors that disrupt a slot mode return current path in a distributed source node. The traveling-wave switch may provide electronically-controllable on/off switching on high-frequency signals. The layouts generally provide that only a microstrip mode current may travel along a given radio frequency (RF) path between two ports of the switches. The new layouts may yield better insertion loss and isolation performance of RF traveling-wave switches compared with common layouts. The layouts generally break a path through the distributed source node to a ground node. The breaks may force all return currents in the source nodes through a substrate to a backside metal plane. A result may be that only microstrip mode transmission through a drain node is allowed.

Figure 2:
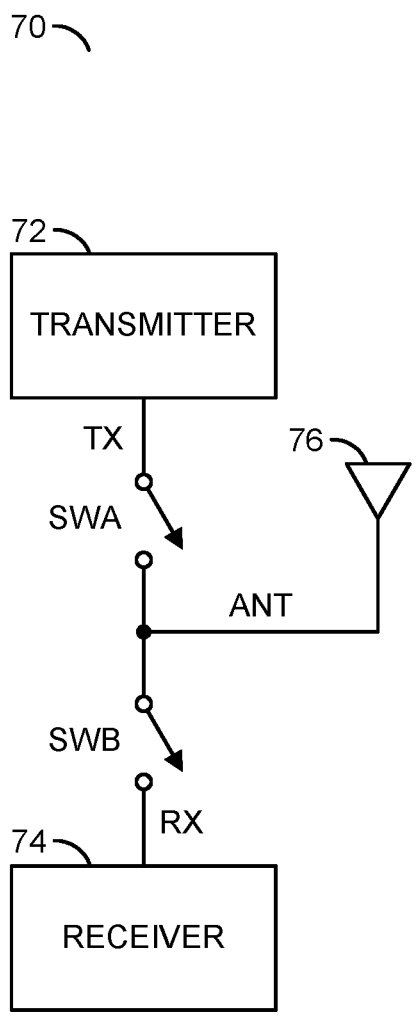
FIG. 2 is a block diagram of a system.

Referring to FIG. 2, a block diagram of an example implementation of a system 70 is shown. The system (or apparatus, or circuit or device) may implement a transceiver. The transceiver 70 generally comprises a block (or circuit) 72, a block (or circuit) 74, a block (or circuit), 76 and multiple blocks (or circuits) SWA and SWB. The transceiver 70 may be implemented with hardware, with hardware and software and/or simulated with software. In various embodiments, the transceiver 70 may be implemented as a single integrated circuit (e.g., a monolithic microwave integrated circuit (MMIC)).

A signal (e.g., TX) may be generated by the circuit 72 and presented to the circuit SWA. The signal TX may be a radio-frequency transmit signal. A signal (e.g., RX) may be presented by the circuit SWB to the circuit 74. The signal RX may be a radio-frequency receive signal. A bidirectional signal (e.g., ANT) may be exchanged between the circuit 76 and the circuits SWA and SWB.

The circuit 72 may implement a transmitter circuit. The transmitter 72 is generally operational to generate data in the transmission signal TX while the system 70 is in the transmit mode.

The circuit 74 may implement a receiver circuit. The receiver 74 is generally operational to receive data in the receive signal RX while the system 70 is in the receiving mode.

The circuit 76 may implement an antenna circuit. While transmitting, the antenna 76 is generally operational to broadcast transmit data generated by the transmitter 72, switched by the circuit SWA and received in the signal ANT. While receiving, the antenna 76 is generally operational to accept receive data, and present the receive data in the signal ANT to the circuit SWB for switching to the receiver 74.

Each circuit SWA and SWB may implement a switch circuit. In various embodiments, the switch circuits SWA and SWB may implement traveling-wave switches. The traveling-wave switch SWA is generally operational to connect/disconnect the transmit signal TX to/from the antennal signal ANT. The traveling-wave switch SWB is generally operational to connect/disconnect the antenna signal ANT to/from the receive signal RX.

The switches SWA and SWB may operate in one of multiple modes (e.g., the transmit mode and the receive mode) at a time as determined by one or more control signals. In the transmit mode, the switch SWA may be commanded into a closed state (or mode) such that the signal TX is switched (or routed) to the signal ANT. Concurrently, the switch SWB may be commanded into an open state (or mode) such that the signal RX is switched (or routed) to a signal ground (or termination). In the receive mode, the switch SWB may be commanded into the closed state such that the signal ANT is switched (or routed) to the signal RX. Concurrently, the switch SWA may be commanded into the open state such that the signal TX is switched (or routed) to the signal ground (or termination).

Figure 3:
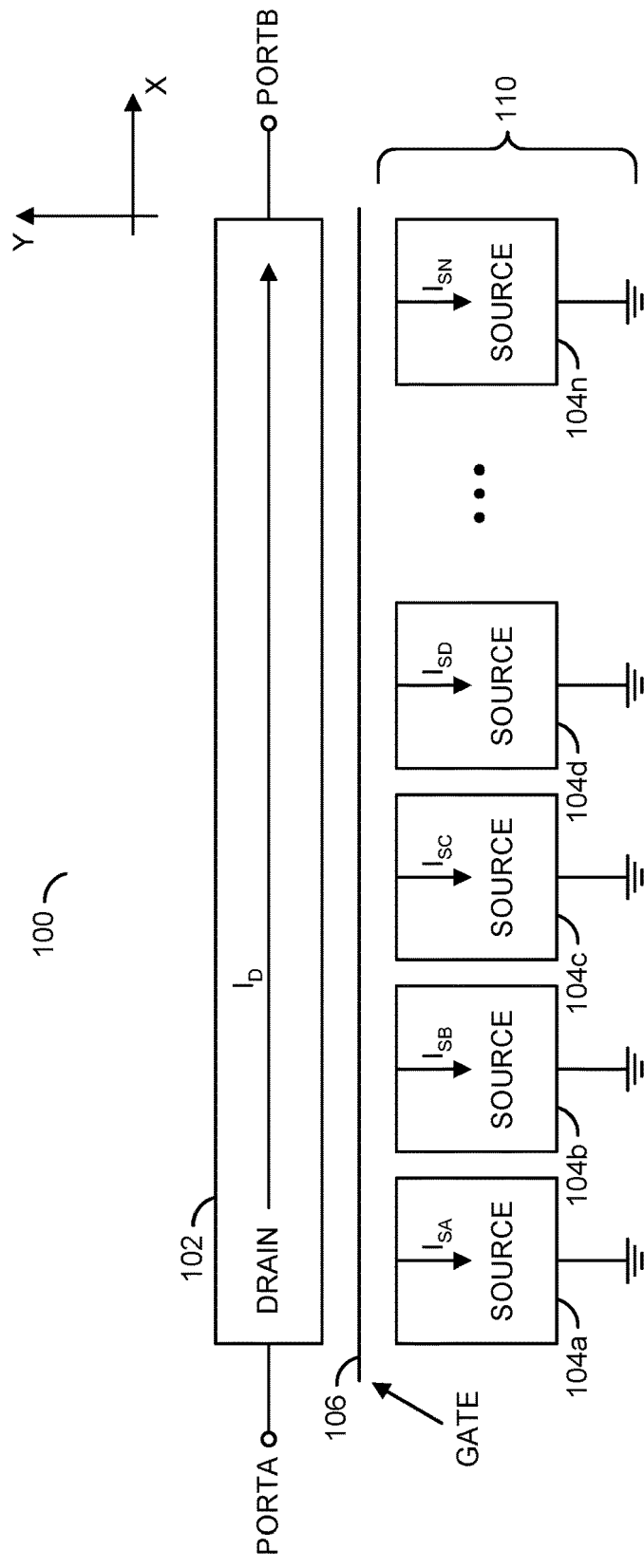
FIG. 3 is a block diagram of a traveling-wave switch in accordance with an embodiment of the invention.

Referring to FIG. 3, a block diagram of an example implementation of a traveling-wave switch 100 is shown in accordance with an embodiment of the invention. The traveling-wave switch 100 may be representative of the switch SWA and/or the switch SWB in FIG. 2. The traveling-wave switch 100 generally comprises a node (or terminal) 102, multiple nodes (or terminals) 104a-104n and a node (or terminal) 106. The node 102 may be connected at one end to an interface (e.g., PORTA) and another interface (e.g., PORTB) at an opposite end. The nodes 102, 104a-104n and 106 may form a field-effect transistor fabricated in a substrate (or wafer) 110. The switch 100 may be implemented with hardware and/or simulated with software. In various embodiments, the switch 100 may be implemented as part of a single integrated circuit (e.g., a MMIC).

The node 102 may implement a drain node of the switch (or transistor) 100. The drain 102 is generally operational to carry a drain current (e.g., $I_D$) received at the interface PORTA. The drain 102 may be oriented along an axis (e.g., an X axis) of the switch 100. While the switch 100 is in the closed state, the drain current $I_D$ may be carried through the drain 102 from the PORTA to the PORTB (in the +X direction) where the current leaves the switch 100. While the switch 100 is in the open state, the drain current $I_D$ may be routed through conductive channels formed beneath the node 106 between the drain node 102 and the nodes 104a-104n. The drain current $I_D$ may enter the nodes 104a-104n (in the −Y direction) as multiple source currents (e.g., $I_{SA}$-$I_{SN}$). When used in FIG. 2, the interface PORTA of the switch SWA may be connected to the transmitter 72 and the interface PORTB of the switch SWA may be connected to the antenna 76. The interface PORTA of the switch SWB may be connected to the antenna 76 and the interface PORTB of the switch SWB may be connected to the receiver 74.

The nodes 104a-104n may collectively implement a source node of the switch (or transistor) 100. The source nodes 104a-104n may be oriented along the X axis and separated from the drain node 102 along the Y axis. The source nodes 104a-104n may be located on a common (or same) side of the drain node 102. While the switch 100 is in the open state, the source nodes 104a-104n may route the drain current $I_D$ into the source currents $I_{SA}$-$I_{SN}$, respectively. While the switch 100 is in the closed state, the source currents may be at a minimal leakage level (e.g., approximately zero amperes).

Figure 1:
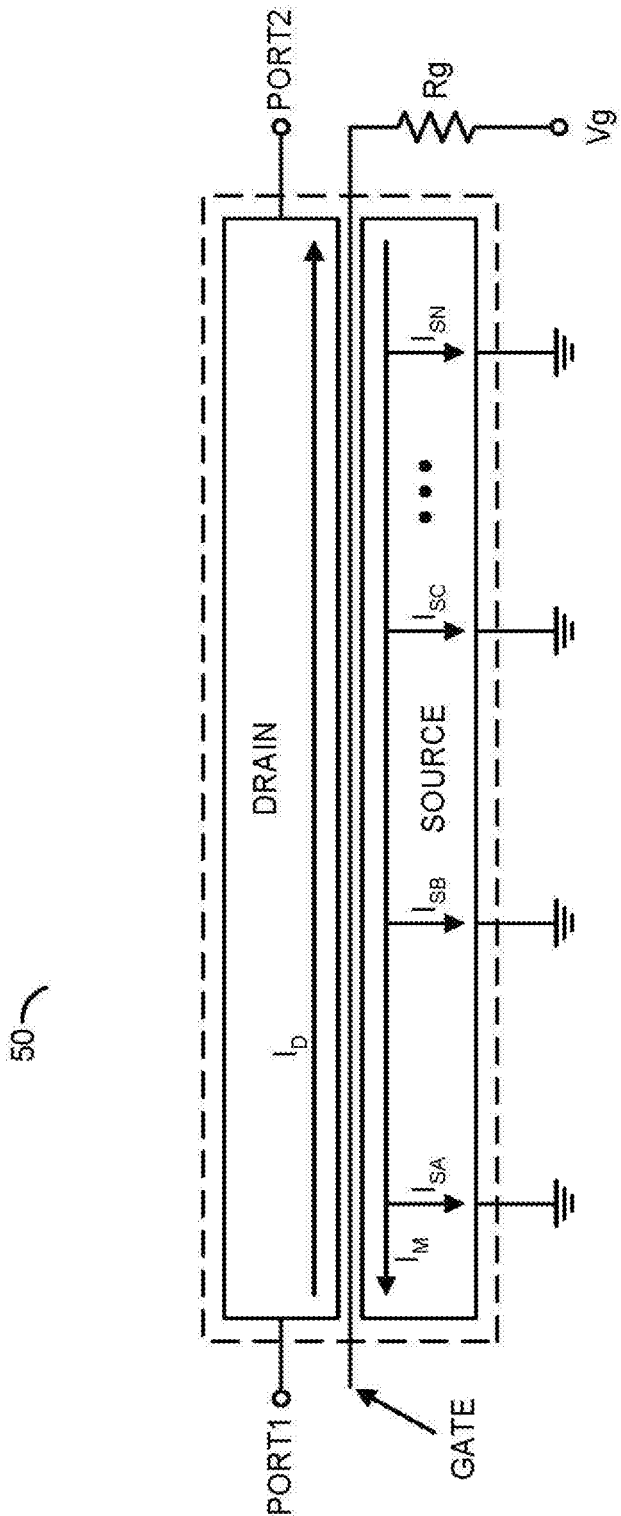
FIG. 1 is a diagram of a conventional traveling-wave switch.

Each source node 104a-104n may be physically isolated from each other. Each source node 104a-104n may be electrically isolated from each other adjoining a surface of the substrate 110 and in the region of the substrate 110 where the channels are formed. Due to the physical and electrical isolation, the parasitic slot mode return current IM {see FIG. 1) may not be induced by the source currents. The disruption of the parasitic slot mode return current IM generally allows the switch 100 to have an improved insertion loss performance and/or an improved isolation performance compared with common traveling-wave switch designs, such as the switch 50. The source nodes 104a-104n may all be electrically coupled to the substrate 110 a distance from the surface of the substrate 110 {e.g., in a bulk of the substrate 110). The substrate 110 may be a semi-insulating material {e.g., Galium Arsenide {GaAs)), a highly resistive material {e.g., a silicon-on-insulator substrate), or an insulator {e.g., glass or sapphire). A regular silicon substrate is generally not used because the low resistance of the silicon material may allow the radio frequency signals to leak to ground.

The node 106 may implement a gate node of the switch (or transistor) 100. The gate node 106 may be oriented along the X axis between the drain node 102 and the source nodes 104a-104. The gate node 106 may be offset from the drain node 102 and the source nodes 104a-104n along the Y axis. The gate node 106 is generally operational to control a conductivity of the channels formed in the substrate 110 between the drain node 102 and the source nodes 104a-104n. While the gate node 106 has a voltage above a threshold voltage, the conductive channels may be formed in the substrate 110, and the switch 110 is considered to be in the closed state. While the gate node 106 has a voltage below the threshold voltage, the conductive channels are not formed in the substrate 110, and the switch 110 is considered to be in the open state.

The substrate 110 may implement a semiconductor substrate. The substrate 110 generally provides mechanical support to the switch 100. The substrate 110 may be a semi-insulating material (e.g., GaAs), a highly resistive material (e.g., a silicon-on-insulator substrate), or other true insulator (e.g., glass or sapphire). In some embodiments, the dopant may be an n-type dopant. In other embodiments, the dopant may be a p-type dopant. The substrate 110 may be lightly doped "n-" or "p-" (e.g., $10^{14}$ to $10^{16}$ atoms/cm$^3$), doped "n" or "p" (e.g., $10^{16}$ to $10^{18}$ atoms/cm$^3$) or heavily doped "n+" or "p+" (e.g., >$10^{18}$ atoms/cm$^3$).

In various embodiments, the switch 100 may operate in a range of frequencies from super high frequencies to extremely high (or millimeter-wave) frequencies (e.g., 3 gigahertz (GHz) to 300 GHz). For some embodiments, the current signal $I_D$ may reside in a range of 3 GHz to 110 GHz. In other embodiments, the switch 100 may operate at microwave frequencies. Other frequency bands of operation may be implemented to meet the design criteria of a particular application.

Figure 4:
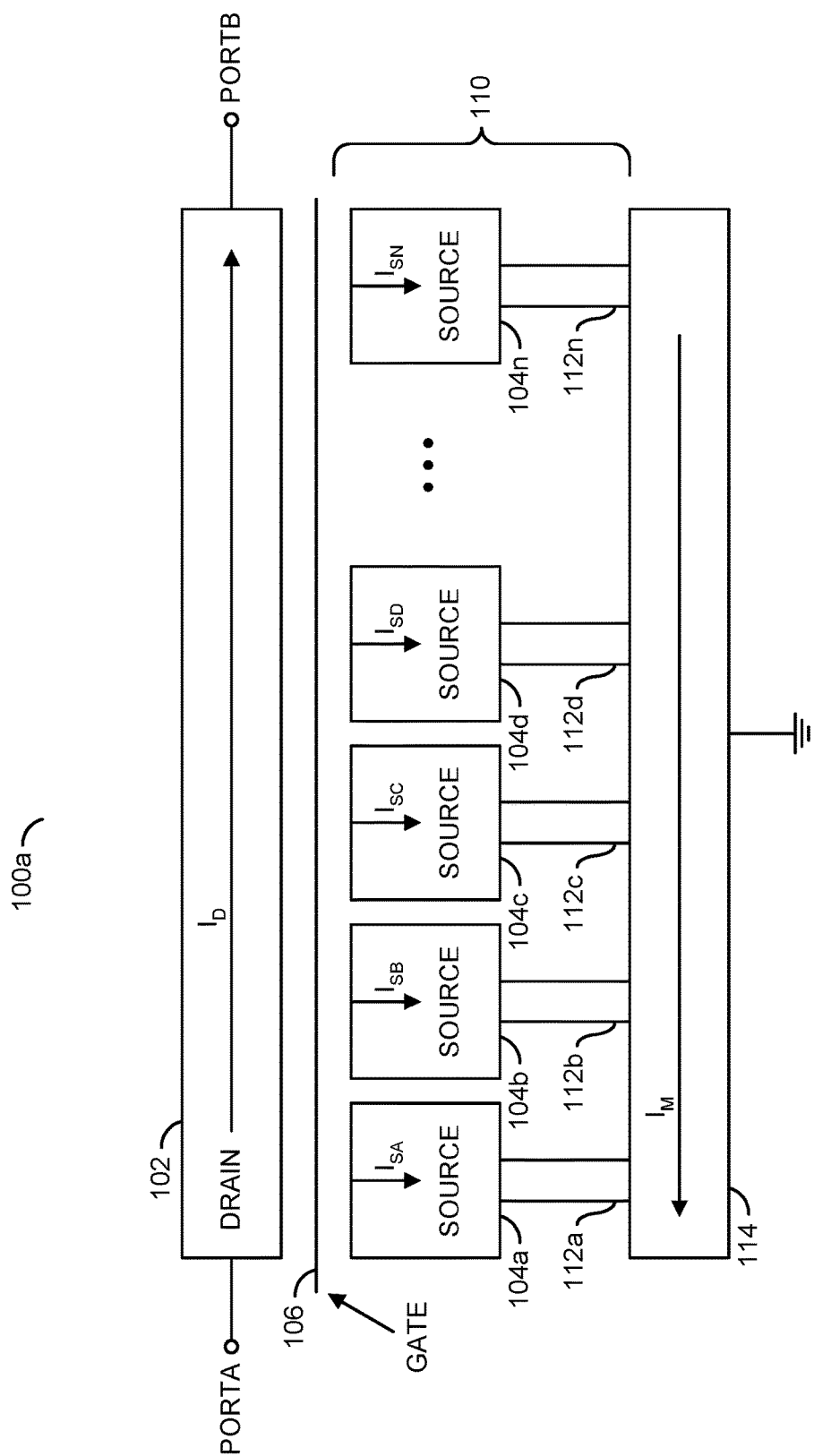
FIG. 4 is a diagram of another traveling-wave switch.

Referring to FIG. 4, a diagram of an example implementation of another traveling-wave switch 100a is shown. The switch 100a may be a variation of the switch 100. The switch 100a generally comprises the drain node 102, the source nodes 104a-104n, the gate node 106, the substrate 110, multiple blocks (or circuits) 112a-112n, a block (or circuit) 114 and the interfaces PORTA and PORTB. The switch 100a may be implemented with hardware and/or simulated with software. In various embodiments, the switch 100a may be implemented as part of a single integrated circuit (e.g., a MMIC).

The circuits 112a-112n may implement conductive vias. The conductive vias 112a-112n may be formed in the substrate 110 between the source nodes 104a-104n and the circuit 114. The conductive vias 112a-112n may be operational to carry the source currents $I_{SA}$-$I_{SN}$ from the source nodes 104a-104n to the circuit 114. In some embodiments, the conductive vias 112a-112n may be fabricated with inner walls coated (e.g., electroplated) with a conductive material (e.g., metal). In other embodiments, the conductive vias 112a-112n may be completely filled with a conductive material (e.g., metal).

The circuit 114 may implement a conductive plane (or surface). The conductive plane 114 may be formed on a backside of the substrate 110, opposite the source nodes 104a-104n, gate 106 and drain 102. The conductive plane 114 is generally operational to collect the source currents $I_{SA}$-$I_{SN}$ remotely from the active conductive channels formed under the gate node 106. The conductive plane 114 may return the combined source currents $I_{SA}$-$I_{SN}$ (e.g., the slot mode return current $I_M$) to the ground node without degrading the performance of the switch 100a.

The conductive plane 114 may be fabricated from a conductive material (e.g., metal). Example materials may include, but are not limited to, aluminum, gold, copper, iron or similar metals. In various embodiments, the conductive plane 114 may cover the entire back side of the substrate 110. In other embodiments, the conductive plane 114 may span a limited area (e.g., under the vias 112a-112n).

Figure 5:
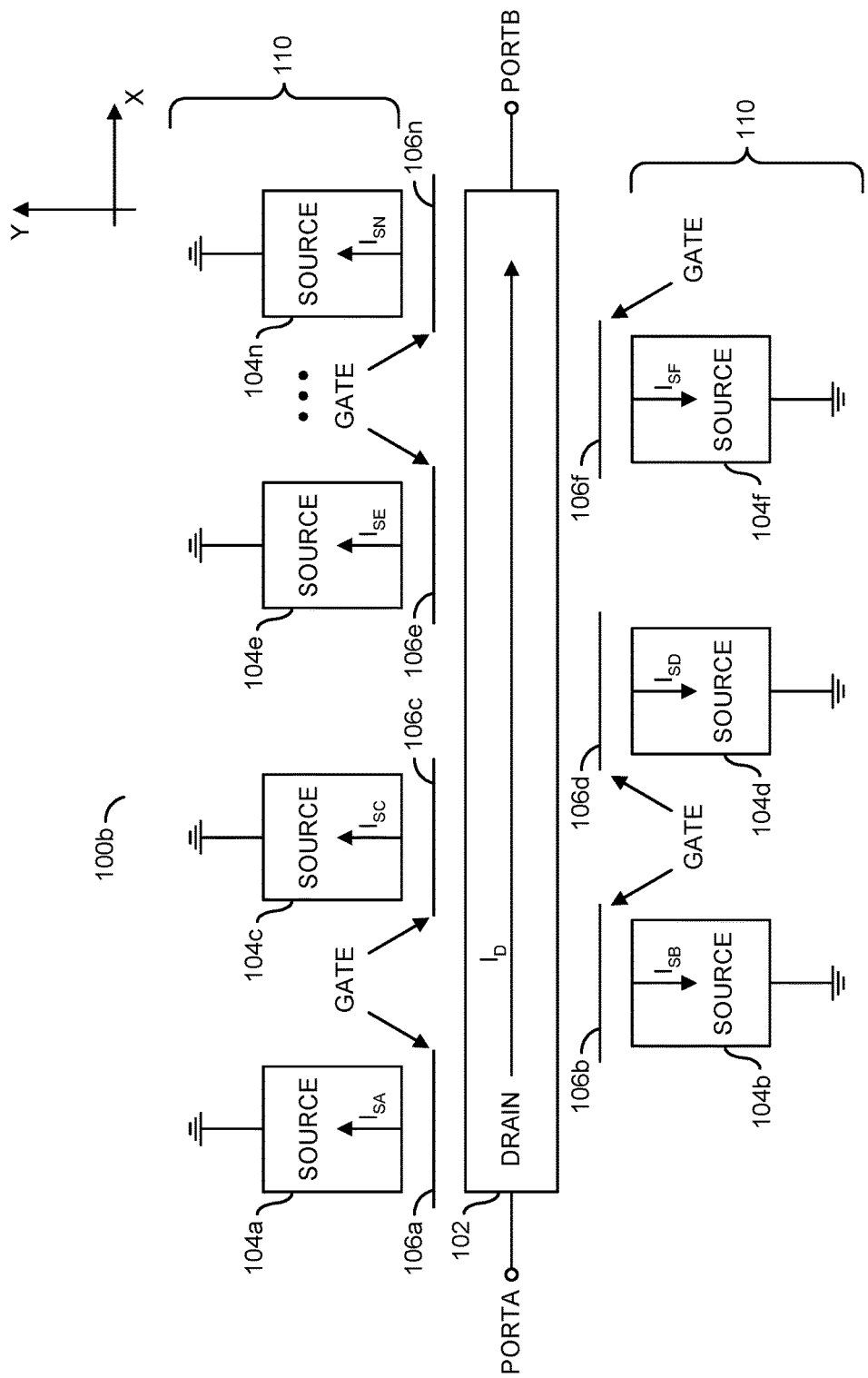
FIG. 5 is a diagram of still another traveling-wave switch.

Referring to FIG. 5, a diagram of an example implementation of another traveling-wave switch circuit 100b is shown. The switch 100b may be a variation of the switch 100 and/or the switch 100a. In various embodiments, the switch 100b may be implemented as part of a single integrated circuit (e.g., a MMIC).

The switch 100b may have a layout where the source nodes 104a-104n are distributed on two sides of the drain node 102. The gate node 106 may be divided into multiple gates 106a-106n, a gate node between each source node 104a-104n and the drain node 102. Distribution of the source nodes 104a-104n to both sides of the drain node 102 may result in a different performance of the switch 100b compared with the switch 100. For example, the switch 100b may have a better insertion loss performance above 90 GHz than the switch 100. Different layout arrangements may be implemented to provide a convenient physical layout in small spaces. The switch 100 generally does not have to be arranged in a straight line. The switch 100 may meander to save space or to reach certain output/input locations.

Figure 6:
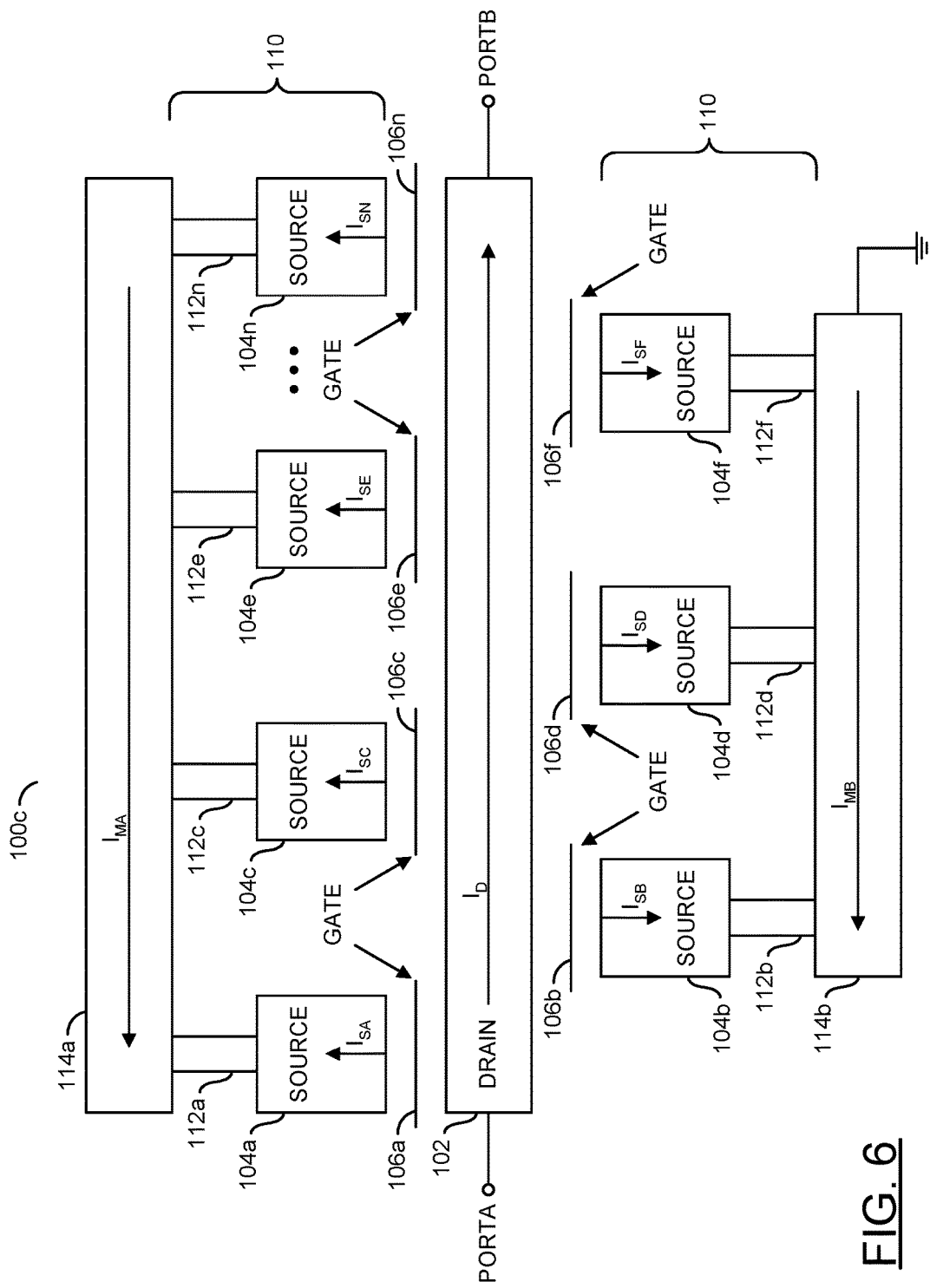
FIG. 6 is a diagram of another traveling-wave switch.

Referring to FIG. 6, a diagram of an example implementation of another traveling-wave switch circuit 100c is shown. The switch 100c may be a variation of the switch 100, 100a and/or the switch 100b. In various embodiments, the switch 100c may be implemented as part of a single integrated circuit (e.g., a MMIC).

The switch 100c may have a layout where the source nodes 104a-104n are distributed on two sides of the drain node 102. The switch 100c may also include the conductive plane 114. As illustrated, the conductive plane 114 may be split into a conductive plane 114a and another conductive plane 114b. The gate node 106 may be divided into multiple gates 106a-106n, a gate node between each source node 104a-104n and the drain node 102.

Figure 7:
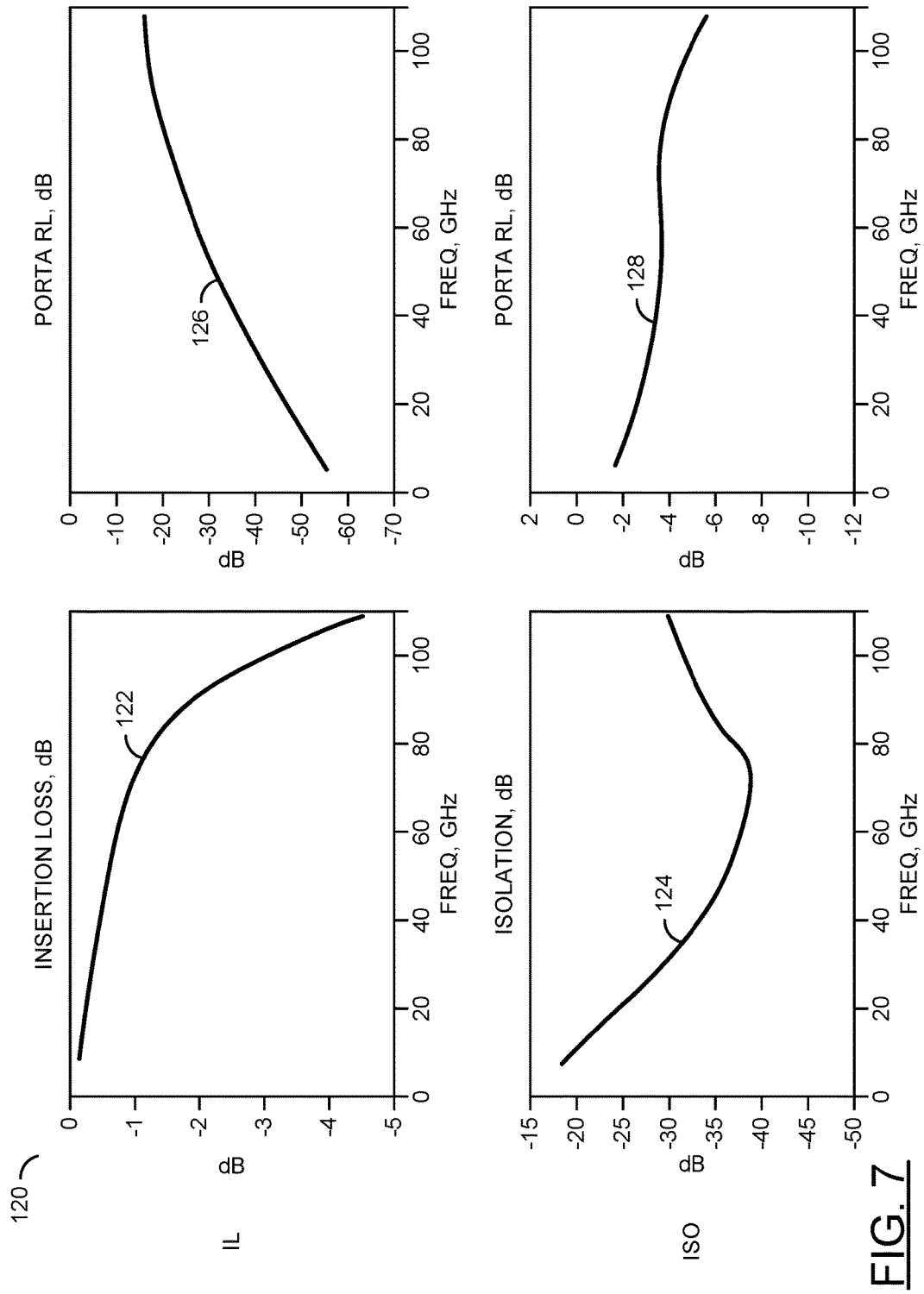
FIG. 7 is a diagram of a set of performance graphs of the traveling-wave switch shown in FIG. 3.

Referring to FIG. 7, a diagram 120 of a set of performance graphs of the traveling-wave switch 100 (FIG. 3) is shown. The performance characteristics may include an insertion loss (IL) performance curve 122 (in decibels (dB)), an isolation (ISO) performance curve 124 (in decibels) an input return loss (RL) performance curve 126 (in decibels) as seen looking into PORTA or PORTB when the switch is closed (insertion loss state), and an input return loss (RL) performance curve 128 (in decibels) as seen looking into PORTA or PORTB when the switch is open (isolation state). The curves 122-126 may be shown over a frequency range of 3 GHz to 110 GHz.

Figure 8:
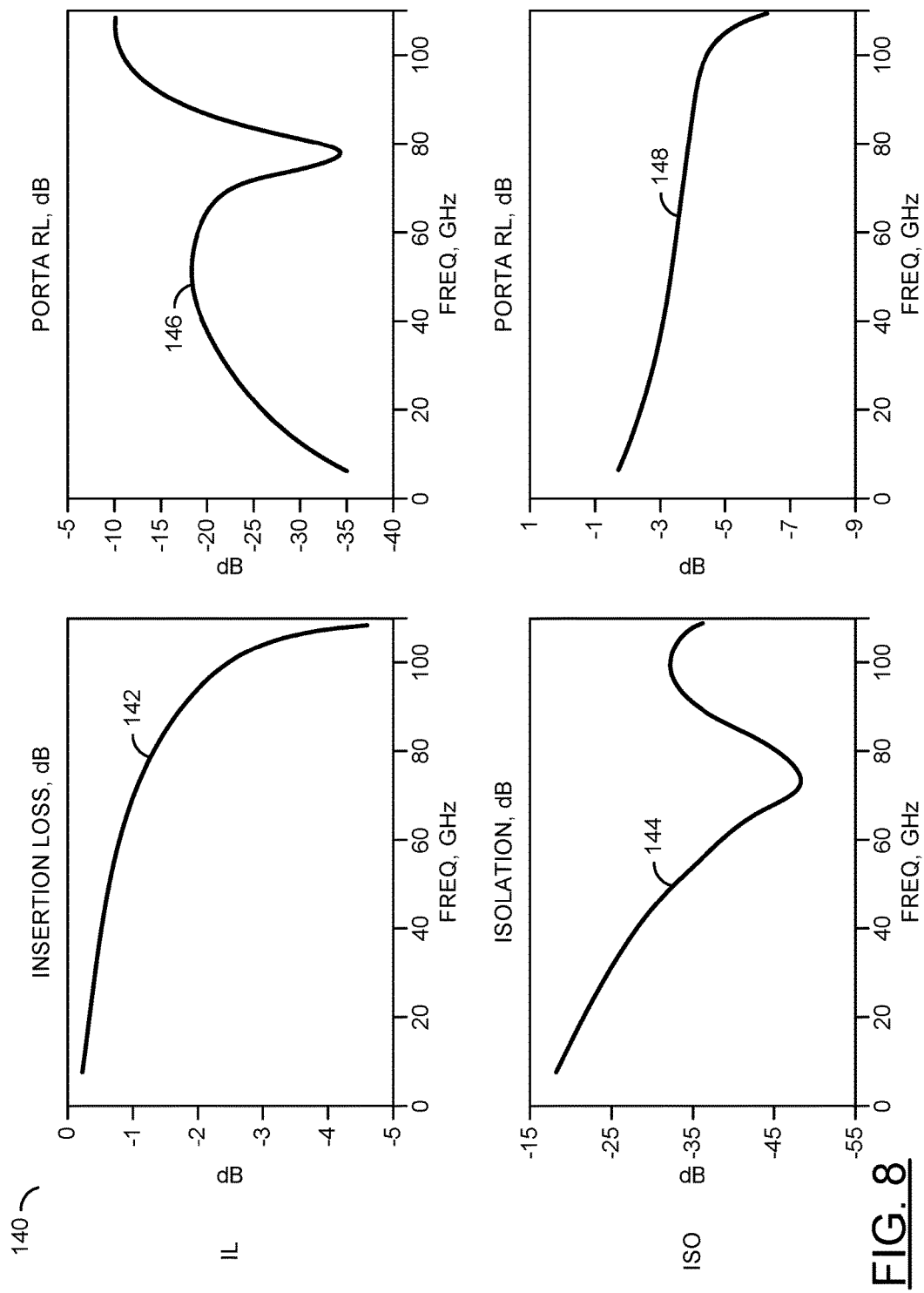
FIG. 8 is a diagram of a set of performance graphs of the traveling-wave switch shown in FIG. 5.

Referring to FIG. 8, a diagram 140 of a set of performance graphs of the traveling-wave switch 100b (FIG. 5) is shown. The performance characteristics may include an insertion loss (IL) performance curve 142 (in decibels), an isolation (ISO) performance curve 144 (in decibels), an input return loss (RL) performance curve 146 (in decibels) as seen looking into PORTA or PORTB when the switch is closed (insertion loss state), and an input return loss (RL) performance curve 148 (in decibels) as seen looking into PORTA or PORTB when the switch is open (isolation state). The curves 142-146 may be shown over a frequency range of approximately 3 GHz to 110 GHz.

Figure 9:
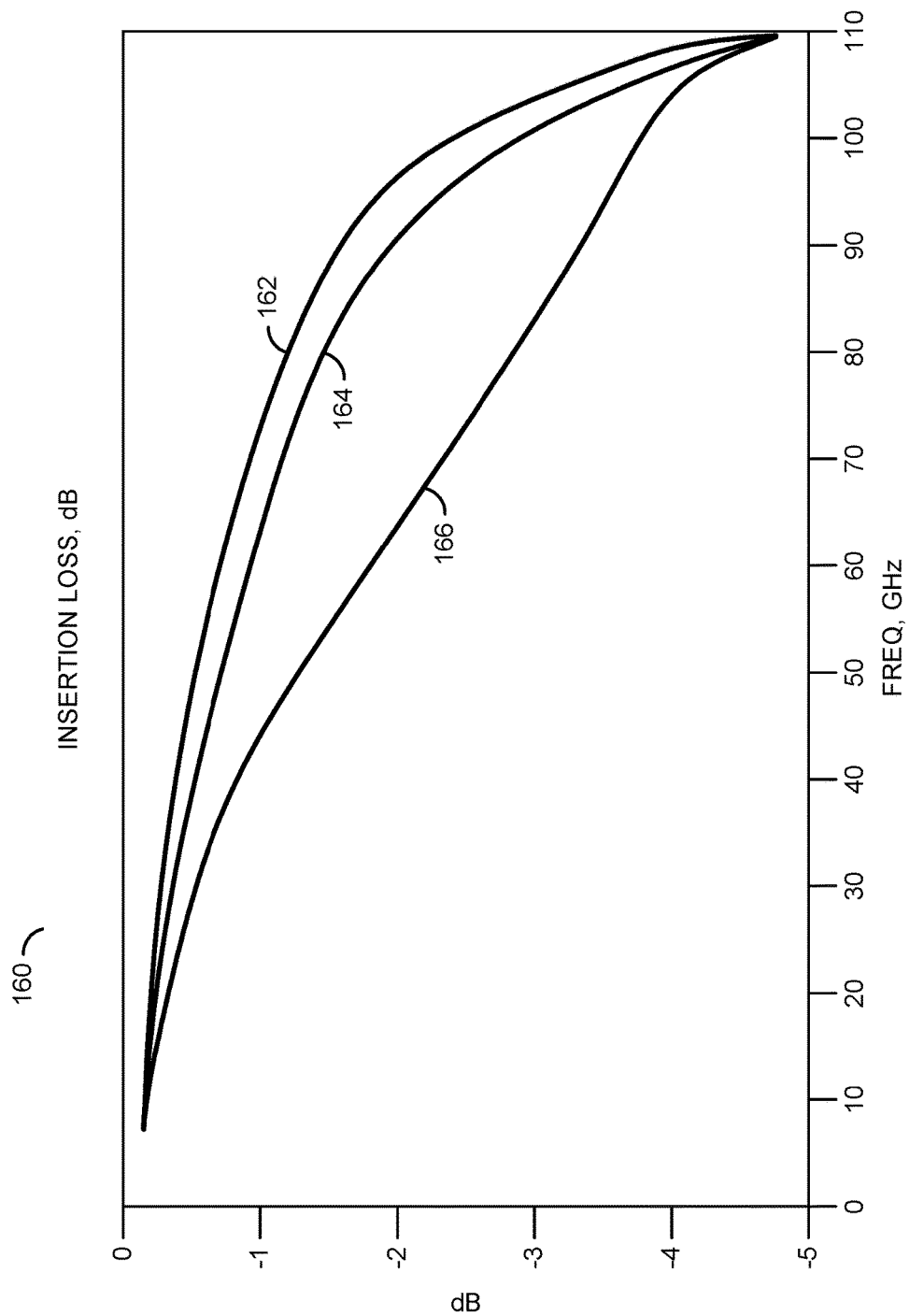
FIG. 9 is a diagram of a set of overlain insertion loss graphs of the traveling-wave switches shown in FIGS. 1, 3 and 5.

Referring to FIG. 9, a diagram 160 of a set of overlain insertion loss graphs of the traveling-wave switches 50, 100 and 100b is shown. The curve 162 may illustrate the insertion loss of the switch 100b (in decibels). The curve 164 may illustrate the insertion loss of the switch 100. The curve 166 generally illustrates the insertion loss of the switch 50. The curves 162-166 may be shown over a frequency range of approximately 3 GHz to 110 GHz. The switches 100 and 100b generally yield an improved (e.g., less) insertion loss performance than the common switch 50 over a wide frequency range (e.g., from 3 GHz to approximately 70 GHz).

Figure 10:
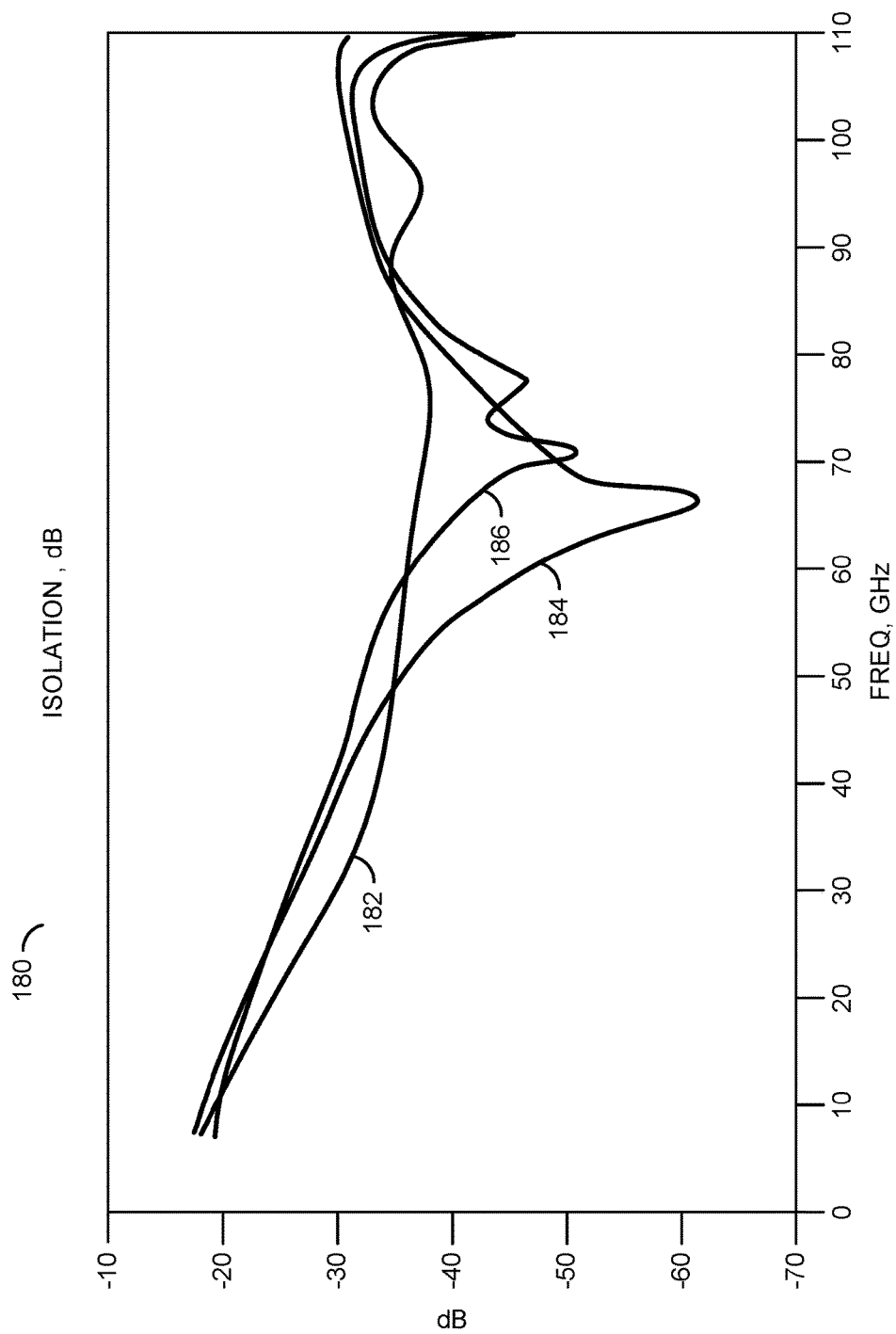
FIG. 10 is a diagram of a set of overlain isolation graphs of the traveling-wave switches shown in FIGS. 1, 3 and 5.

Referring to FIG. 10, a diagram 180 of a set of overlain isolation graphs of the traveling-wave switches 50, 100 and 100b is shown. The curve 182 may illustrate the insertion loss of the switch 100 (in decibels). The curve 184 may illustrate the insertion loss of the switch 50. The curve 186 generally illustrates the insertion loss of the switch 100b. The curves 182-186 may be shown over a frequency range of approximately 3 GHz to 110 GHz. The switches 100 and 100b consistently yield an improved (e.g., greater) isolation performance than the common switch 50 above approximately 40 GHz.

The functions and structures illustrated in the diagrams of FIGS. 1 to 10 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a drain node configured to transfer a drain signal along a first axis from a first port to a second port;
   a plurality of source nodes distributed along said first axis, formed to be electrically isolated from each other, and configured to transfer a plurality of source signals along a second axis from said drain node to a ground node; and
   a gate node arranged in parallel to said drain node and configured to control said source signals in response to a gate voltage, wherein said drain node, said source nodes and said gate node form a traveling-wave switch that blocks a slot mode current through said source nodes.

2. The apparatus according to claim 1, wherein said drain signal has a frequency in a range of 3 gigahertz to 70 gigahertz.

3. The apparatus according to claim 2, wherein an isolation from said first port to said second port is greater than −30 dB over said range of 3 gigahertz to 70 gigahertz while said gate voltage is active.

4. The apparatus according to claim 2, wherein an insertion loss at said first port is at most 1.1 dB over said range of 3 gigahertz to 70 gigahertz while said gate voltage is active.

5. The apparatus according to claim 1, wherein all of said source nodes are located on a same side of said drain node.

6. The apparatus according to claim 5, wherein said source nodes are physically separated from each other.

7. The apparatus according to claim 1, wherein said source nodes are located on both sides of said drain node.

8. The apparatus according to claim 7, wherein every other one of said source nodes is located on an opposite side of said drain node.

9. The apparatus according to claim 1, further comprising a conductive plane configured to carry said source signals to said ground node, wherein said conductive plane is disposed on a side of a substrate opposite said source nodes.

10. The apparatus according to claim 9, further comprising a plurality of vias configured carry said source signals through said substrate from said source nodes to said conductive plane.

11. A method for traveling-wave switching, comprising the step of:
    transferring a drain signal along a first axis from a first port to a second port of a drain node;
    transferring a plurality of source signals along a second axis from said drain node through a plurality of source nodes to a ground node, wherein said source nodes are distributed along said first axis and formed to be electrically isolated from each other; and
    controlling said source signals in response to a gate voltage in a gate node, wherein said gate node is arranged in parallel to said drain node and said drain node, said source nodes and said gate node form a traveling-wave switch that blocks a slot mode current through said source nodes.

12. The method according to claim 11, wherein said drain signal has a frequency in a range of 3 gigahertz to 70 gigahertz.

13. The method according to claim 12, wherein an isolation from said first port to said second port is greater than −30 dB over said range of 3 gigahertz to 70 gigahertz while said gate voltage is active.

14. The method according to claim 12, wherein an insertion loss at said first port is at most 1.1 dB over said range of 3 gigahertz to 70 gigahertz while said gate voltage is active.

15. The method according to claim 11, wherein all of said source nodes are located on a same side of said drain node.

16. The method according to claim 15, wherein said source nodes are physically separated from each other.

17. The method according to claim 11, wherein said source nodes are located on both sides of said drain node.

18. The method according to claim 17, wherein every other one of said source nodes is located on an opposite side of said drain node.

19. The method according to claim 11, further comprising the step of: carrying said source signals to said ground node through a conductive plane, wherein said conductive plane is disposed on a side of a substrate opposite said source nodes.

20. The method according to claim 19, further comprising the step of: carrying said source signals in a plurality of vias through said substrate from said source nodes to said conductive plane.

* * * * *